United States Patent [19]

Maudsley

[11] Patent Number: 4,628,262

[45] Date of Patent: Dec. 9, 1986

[54] MULTIPLE ECHO CHEMICAL SHIFT IMAGING

[75] Inventor: Andrew A. Maudsley, Boston, Mass.

[73] Assignee: Advanced NMR Systems, Inc., Woburn, Mass.

[21] Appl. No.: 697,972

[22] Filed: Feb. 5, 1985

[51] Int. Cl.⁴ ............................................. G01R 33/20
[52] U.S. Cl. ..................................... 324/309; 324/307
[58] Field of Search ................ 324/300, 307, 309, 312, 324/313, 314

[56] References Cited

U.S. PATENT DOCUMENTS

| | | | |
|---|---|---|---|
| 4,297,637 | 10/1981 | Crooks et al. | 324/307 |
| 4,354,499 | 10/1982 | Damadian | 128/653 |
| 4,361,807 | 11/1982 | Burl et al. | 324/309 |
| 4,383,219 | 5/1983 | Kaplan | 324/309 |
| 4,431,968 | 2/1984 | Edelstein | 324/309 |
| 4,480,228 | 10/1984 | Bottomley | 324/309 |
| 4,570,119 | 2/1986 | Wehrli | 324/309 |

OTHER PUBLICATIONS

W. Dixon, "Simple Proton Spectroscopic Imaging", *Radiology*, vol. 153, No. 1 (Oct. 1984), pp. 189–194.

P. Mansfield, J. Phys. D, "Spatial Mapping of the Chemical Shift in NMR", *J. Phys. D. Appl. Phys.*, vol. 16, (1983), pp. L-235–L-238.

A. F. Mehlkopf et al., "A Multiple Echo and Multiple Shot Sequence for Fast NMR Fourier Imaging", Scientific Program, Soc. of Magn. Res. in Med., 2nd Ann. Mtg., Aug. 16–19, 1983, San Francisco, Abstract No. 25, Works in Progress (2 Sheets).

A. A. Maudsley et al., "Field Inhomogeneity Correction and Data Processing for Spectroscopic Imaging", *J. Magn. Reson. in Med.*, accepted for publ. in vol. 2, No. 2, (1985).

I. L. Pykett et al., "Nuclear Magnetic Resonance: In Vivo Proton Chemical Shift Imaging", *Radiology*, vol. 149, No. 1, (1983), pp. 197–201.

A. A. Maudsley et al., "Electronics and Instruments for NMR Imaging", *IEEE Transactions on Nuclear Science*, vol. NS-31, No. 4, (Aug. 1984), pp. 990–993.

D. I. Hoult, "Rotating Frame Zeugmatography", *J. Magn. Reson.*, vol. 33, (1979), pp. 183–197.

J. K. T. Lee et al., "Fatty Infiltration of Liver: Demonstration by Proton Spectroscopic Imaging", *Radiology*, vol. 153, No. 1, (Oct. 1984), pp. 195–201.

P. Mansfield, "Spatial Mapping of the Chemical Shift in NMR", *Magnetic Resonance in Medicine*, vol. 1, (1984), pp. 370–386.

Z. H. Cho et al., "Echo Time Encoded Chemical Shift NMR Spectroscopic Imaging Technique", Proceedings, Society of Magnetic Resonance in Medicine, 3rd Ann. Mtg., Aug. 13–17, 1984, New York, pp. 155–156.

R. E. Sepponen et al., "A Method for Chemical Shift Imaging: Demonstration of Bone Marrow Involvement with Proton Chemical Shift Imaging", *Journal of Computer Assisted Tomography*, vol. 8, No. 4, (Aug. 1984), pp. 585–587.

Andrew A. Maudsley, "In Vivo Spectroscopic Imaging", in P. D. Esser, R. E. Johnston, eds., *Technology of Nuclear Magnetic Resonance*, The Society of Nuclear Medicine, Inc. (New York, 1984), pp. 167–177.

*Primary Examiner*—Michael J. Tokar
*Attorney, Agent, or Firm*—Ostrolenk, Faber, Gerb & Soffen

[57] ABSTRACT

In the disclosed pulse and gradient switching sequences, refocusing pulses are timed to provide spectral encoding so that a resulting series of spin echoes each include both spatial and spectral information for chemical shift imaging. Atoms within an object are excited and may then be spatially encoded, as by a phase encoding gradient. A series of refocusing pulses is then applied, each followed by an observation gradient field. Each of the refocusing pulses after the first one may be displaced in time relative to the observation gradients in order to provide spectral encoding. In an alternative embodiment for limited spectral resolution of fat and water, the observation gradients may also be timed so that echoes may be added to compensate for the decreasing amplitudes of the successive spin echoes. In order to increase the spatial resolution, a multiple shot excitation sequence may be applied, each shot beginning with an excitation pulse, with the first refocusing pulse after each excitation pulse occurring after a corresponding initial time interval. In order to obtain the desired resolution, the initial time interval may be incremented by TE/2M+dt/M for each successive excitation pulse, where TE is the time between successive spin echoes, dt is the delay time of subsequent refocusing pulses and M is the total number of excitation pulses. As a result, any desired level of resolution may be obtained.

18 Claims, 7 Drawing Figures

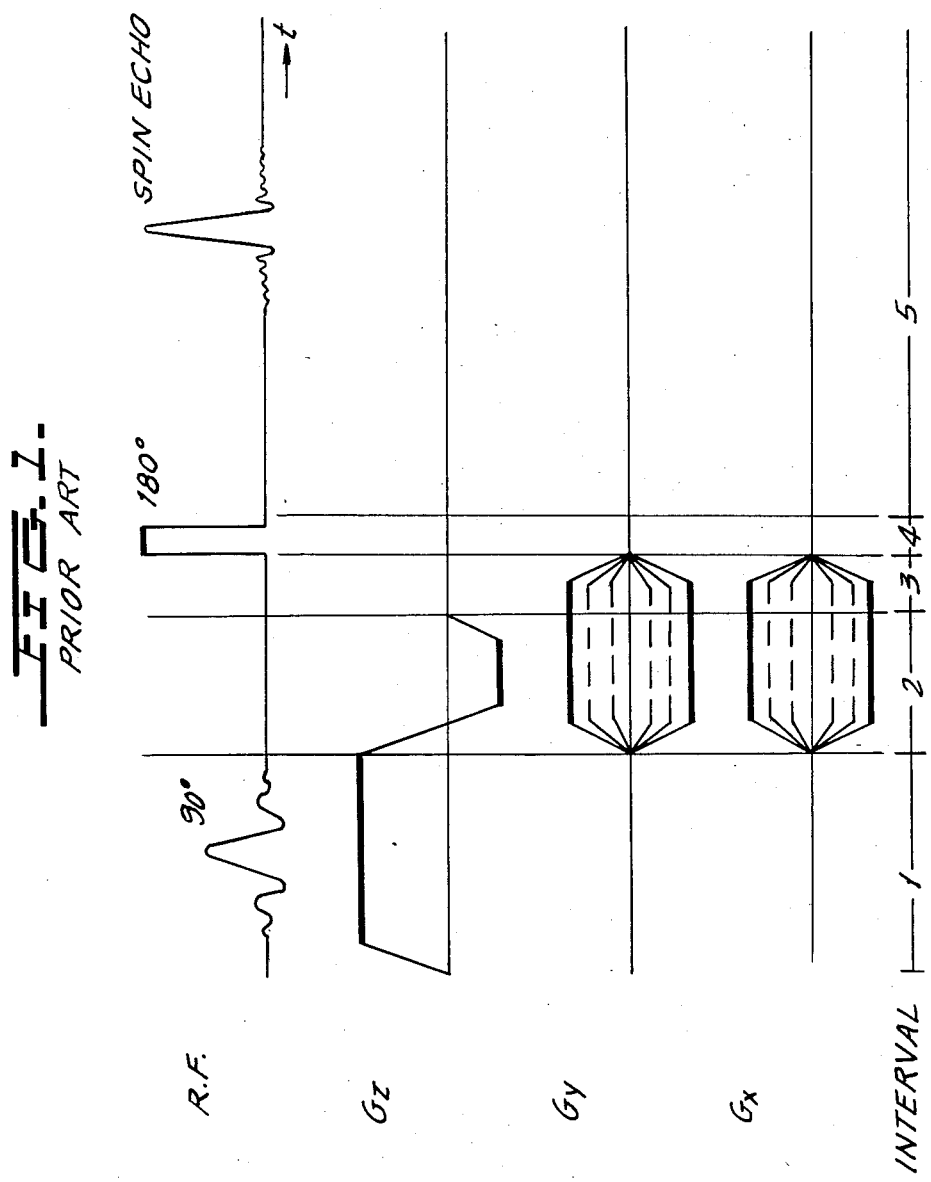

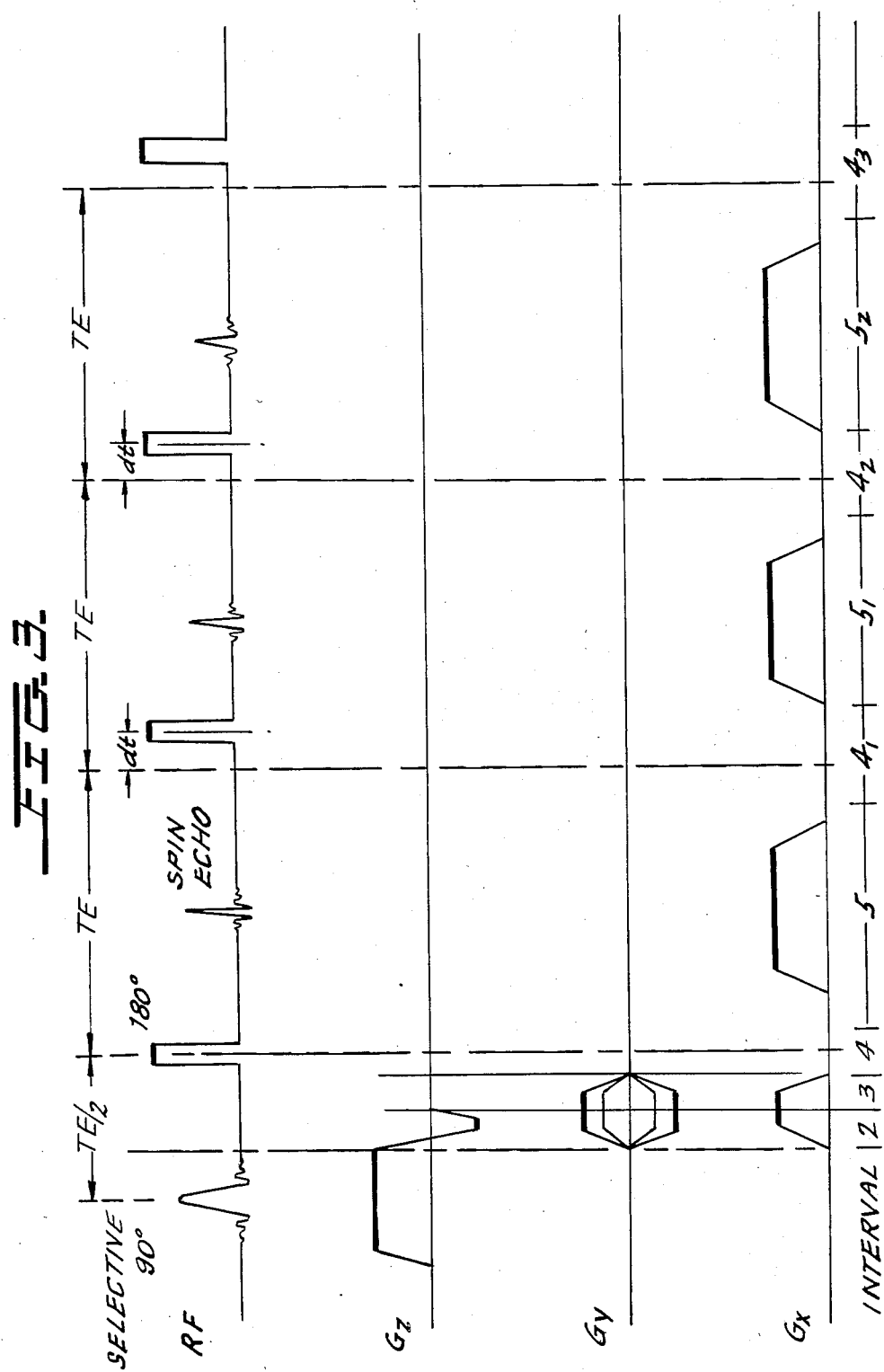

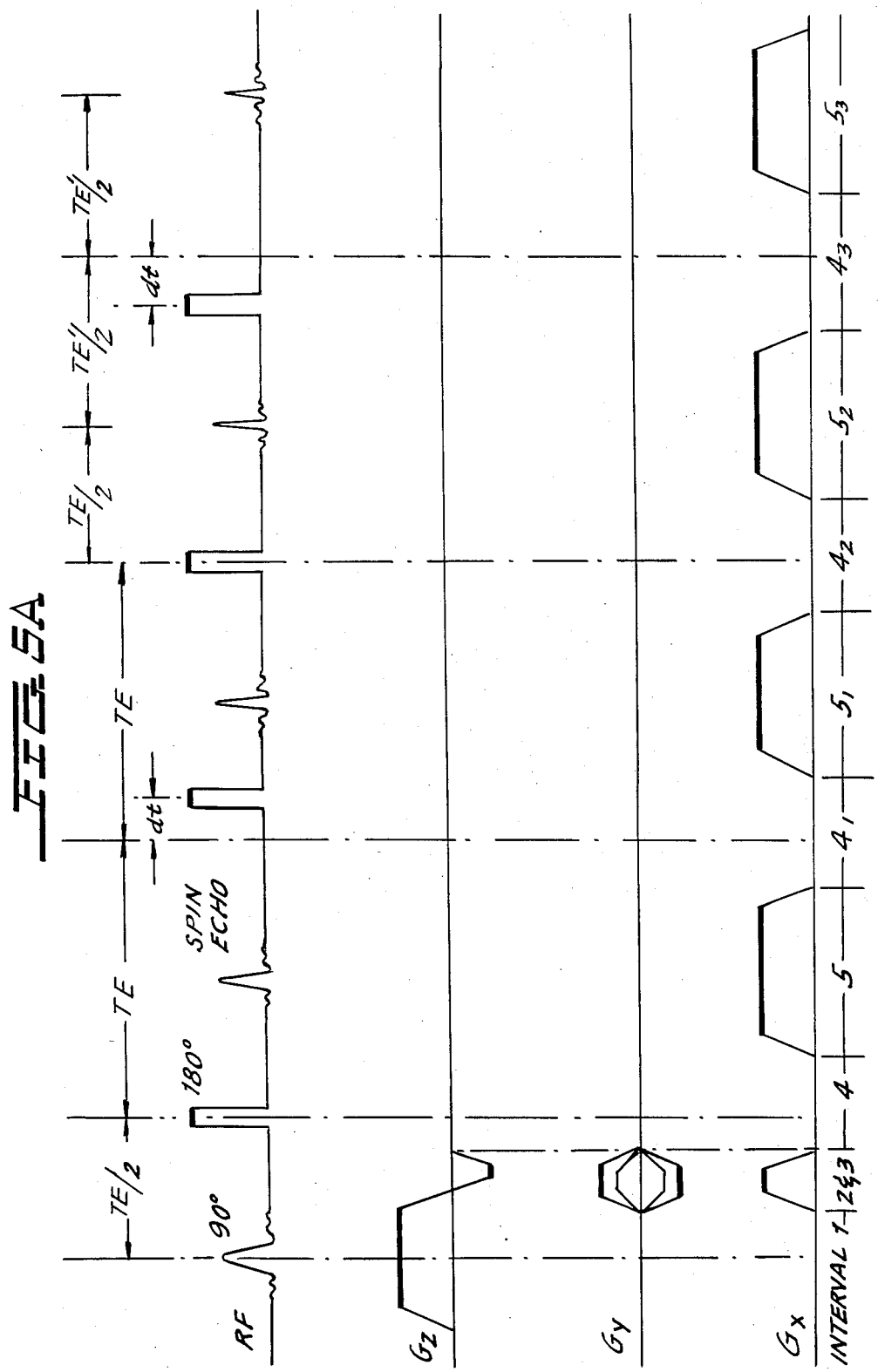

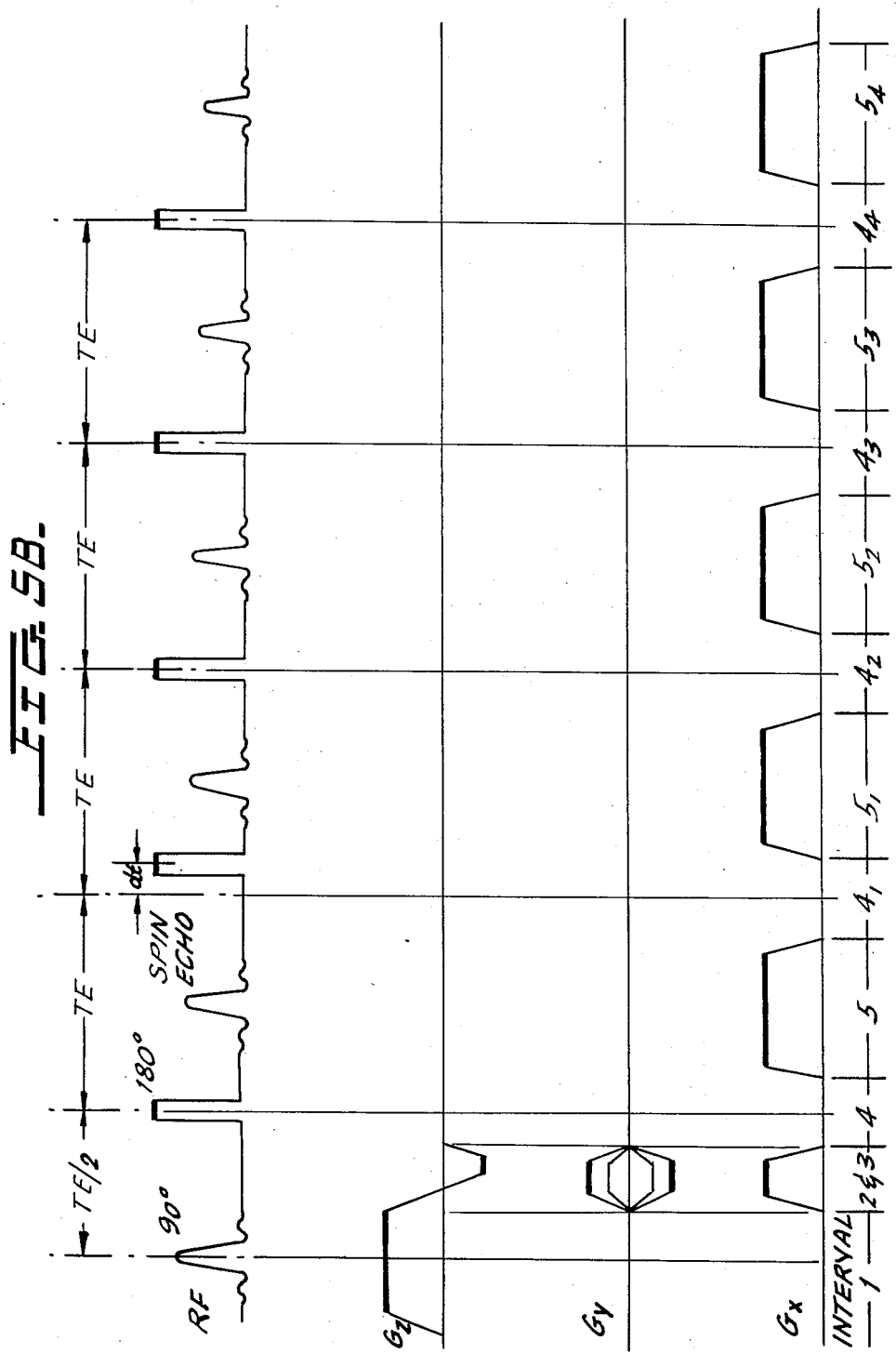

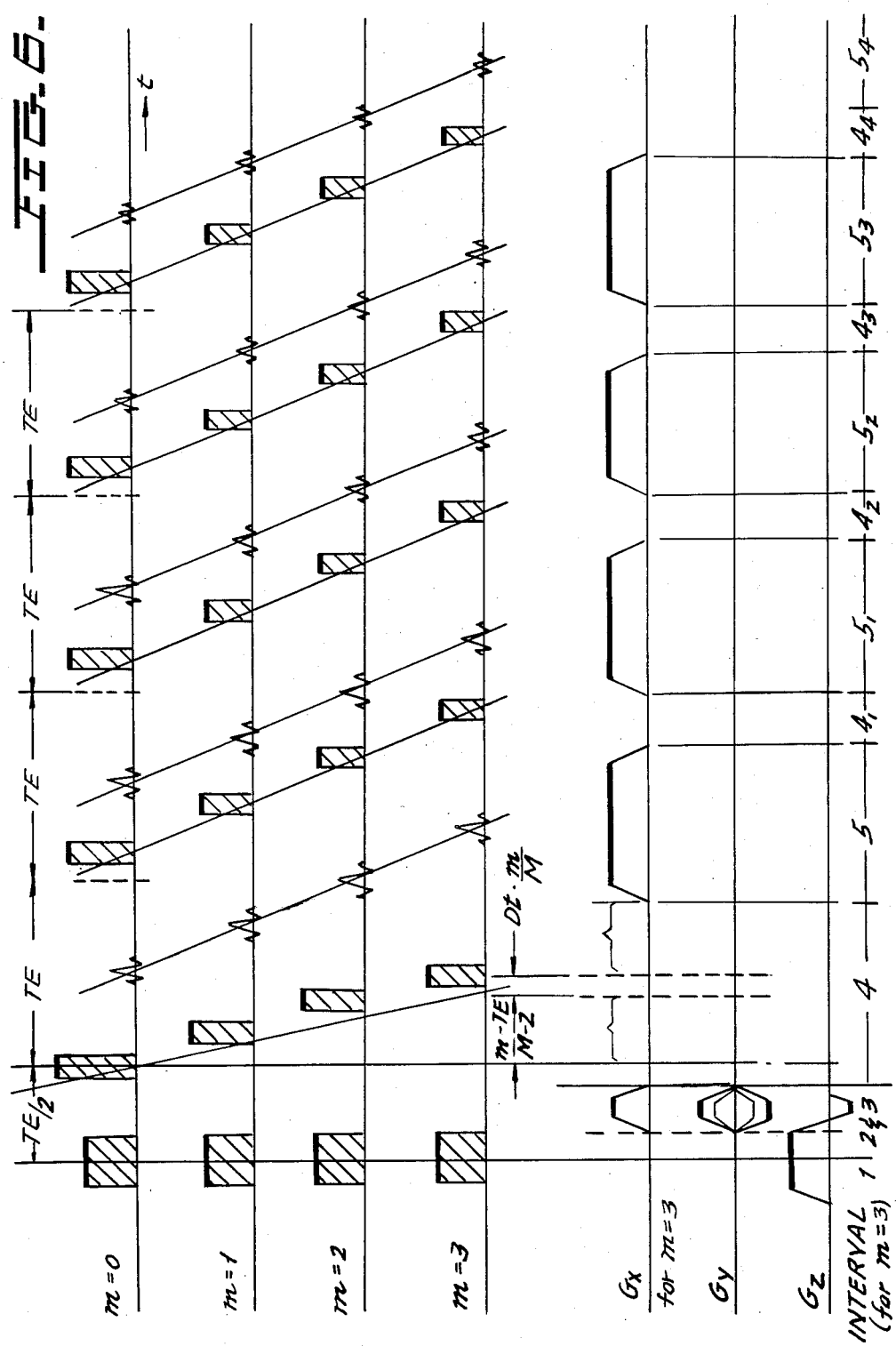

MULTIPLE ECHO CHEMICAL SHIFT IMAGING

BACKGROUND OF THE INVENTION

1. Field of the Invention

The invention relates to the acquisition of NMR data from which a chemical shift image may be obtained.

2. Description of the Prior Art

Nuclear magnetic resonance (NMR) techniques have long been used to obtain spectroscopic information about substances. More recently, a number of NMR techniques have emerged for obtaining images of an object. Some techniques now provide spectroscopic information in a spatial image, making it possible, for example, to display an image of a slice of an object in which the concentrations of different chemical substances at each location in the slice are shown. This type of imaging will be referred to herein as "spectroscopic imaging".

A central problem in spectroscopic imaging is the encoding of the spectral information. For example, to perform Fourier imaging, in which the spatial image is ultimately obtained by taking a Fourier transform, the pulse and gradient switching sequence shown in FIG. 1 may be used. During interval 1, a 90° excitation pulse is applied in the presence of gradient $G_z$ applied along the Z axis. This combination excites the atoms in a single slice of an object causing the atoms of that slice to begin to decay from an excited state. As the spins of the atoms decay or evolve, a reversed gradient $G_z$ is applied during interval 2 and phase encoding gradients $G_x$ and $G_y$ are applied during intervals 2 and 3. Gradients $G_x$ and $G_y$ provide an encoding according to the location of the atoms in the selected slice. During interval 4, a 180° refocusing pulse is applied, after which, during interval 5, a spin echo is received and sampled. A data set is built up by applying a number of combinations of the values of $G_x$ and $G_y$, and the spin echoes of this data set may then be transformed together through a three-dimensional Fourier transform to provide a spectroscopic image of the X-Y plane in which the third dimension shows the high resolution spectrum, as explained below. The spatial resolution can be increased by sampling a larger number of spin echo signals for increasing magnitudes of the phase encoding gradients $G_x$ and $G_y$.

In the example shown in FIG. 1, the spectral information is encoded directly in the spin echo, and emerges when a Fourier transform of the spin echo is taken. Each chemical compound of a specific element will have one or more characteristic resonances offset in frequency from the basic resonance of that element. Therefore, the frequencies contained in the spin echo will correspond to the compounds of the element being imaged. When a Fourier transform of the spin echo is taken, the resulting spectrum will have a peak corresponding to each compound, the amplitude of the peak reflecting the concentration of that compound. If a data set containing several spin echoes as described above is transformed, an image showing the high resolution spectrum at each location will be produced, showing the concentrations of the compounds at each spatial location.

FIG. 2 illustrates an alternative technique for encoding the spectral information, in which a selective 90° excitation pulse is similarly applied in the presence of gradient $G_z$ during interval 1. Then, during interval 2, gradient $G_z$ is reversed, and during intervals 2 and 3, phase encoding gradient $G_y$ is applied. Also during intervals 2 and 3, an initial prephasing pulse gradient $G_x$ is applied in preparation for applying $G_x$ as an observation gradient during the spin echoes. During interval 4, the 180° refocusing pulse is applied. During interval 5, the observation gradient $G_x$ is again applied for a time period which is centered around the center point of the sampling period of the spin echo. As shown in FIG. 2, several different values of gradient $G_y$ are applied in the Fourier method of imaging to obtain a data set to be transformed.

To encode the spectral information in the sequence of FIG. 2, the timing of the 180° pulse may be changed by an increment dt, as shown in rf sequence (b). This introduces a phase error for all spins which are not resonating at a frequency equal to the detection reference frequency, and the phase error is proportional to the frequency offset, resulting in a phase encoding of the spectral information. W.T. Dixon, in a presentation at the Sixty-ninth Scientific Assembly and Annual Meeting of the Radiological Society of North America, Chicago, Nov. 13-18, 1983, published with revisions as "Simple Proton Spectroscopic Imaging," Radiology, Vol. 153, No. 1 (October, 1984), pp. 189-194, discussed an application of this technique in which protons are imaged and dt is selected so that the water and fat spins, which would be aligned if there were no increment dt, point in opposite directions. Therefore, the sum of the image in which the timing of the 180° pulse is not incremented with the image in which it is incremented by dt will be an image of water alone, but the difference between these images will be an image of fat alone.

The above methods for obtaining spectral information each require a large number of data acquisition sequences or shots, each beginning with an excitation, typically a selective 90° excitation pulse, followed by a phase encoding interval, an echo generating waveform such as a refocusing pulse, and a spin echo sampling interval. The delay between sequences or shots is typically relatively long in relation to the length of each sequence. Therefore, it would be advantageous if more than one spin echo could be sampled for spectral information in each data acquisition sequence.

Techniques used in other areas of NMR imaging gather data from a series of echoes. One such technique is the echo-planar method of imaging, in which a series of echoes are obtained after a single excitation pulse by a series of gradient reversals using a strong field gradient in the presence of a low amplitude orthogonal gradient which remains constant throughout the data acquisition sequence. P. Mansfield, "Spatial Mapping of the Chemical Shift in NMR", *J. of Physics D: Applied Physics*, Vol. 16 (1983), pp. L235-L238, discusses the application of echo-planar NMR imaging methods to the mapping of chemical shift data spectra. In this technique, as noted above, the echoes result from a series of reversals of a strong gradient field.

It would be advantageous, however, to have a technique for acquiring NMR information including both spatial and spectral information from a series of echoes without the need for repeated reversal of a strong magnetic gradient, which is relatively difficult to achieve in practice. It would also be advantageous to have such a technique which could obtain greater spatial and spectral resolution.

SUMMARY OF THE INVENTION

The present invention provides a pulse and gradient switching sequence which may be used for conventional Fourier imaging or for other types of NMR imaging, such as projection reconstruction or rotating frame Fourier imaging. This switching sequence generates a series of spin echoes from which spectral information can be acquired without the necessity of repeatedly reversing a strong magnetic gradient. As a result, the present invention makes it possible to acquire the spatial and spectral information necessary for producing a spectroscopic image in an efficient and simple, yet flexible manner. The present invention furthermore provides a pulse and gradient switching sequence which refocuses field inhomogeneity effects. A sequence according to the present invention can be used to obtain any desired level of resolution.

One aspect of the present invention is that the same series of waveforms which generates the spin echoes —a series of 180° refocusing pulses, each followed by an observation gradient—also encodes the spectral information. The present invention is based upon the discovery that the spectral information for a series of echoes may be encoded by the timing of the 180° refocusing pulses in relation to the observation gradients.

The method of the invention thus includes exciting some of the atoms of an object, such as a slice which may be excited by applying a slice selecting gradient field and by applying an excitation pulse during the application of the slice selecting gradient field. Then, a series of 180° refocusing pulses, each followed by an observation gradient field, is provided with at least one refocusing pulse being timed in relation to the following observation gradient field for spectrally encoding the atoms. Each 180° refocusing pulse, together with a following observation gradient field, produces a spin echo signal including both spatial and spectral information, and the spin echo signals are then received in order to acquire NMR information.

The spin echo signals are received and sampled in the presence of the observation gradient, which may be applied in a direction orthogonal to both the slice selecting gradient and to a spatial encoding gradient. Although the spin echoes will occur at a time which depends on the observation gradient, the timing of the preceding refocusing pulse may be varied in order to perform the spectral encoding. The first refocusing pulse may be applied halfway between the center of the excitation pulse and the center of the first spin echo signal. A second refocusing pulse may then be delayed after the time halfway between the centers of the first and second spin echo signals, resulting in spectral encoding. Subsequent refocusing pulses may similarly be timed for additional spectral encoding, as desired.

In one embodiment, the refocusing pulses and observation gradients are timed so that at least one echo in the series contains in-phase information relative to two substances such as water and fat in the object being imaged and at least one echo contains opposed information relative to those substances. As a result, in-phase and opposed images may be obtained which may be added for an image of one substance and subtracted from an image of the other substances. The timing may further produce at least two echoes containing the same one of the in-phase and opposed information, so that those two echoes may be added to compensate for $T_2$ decay. This compensation results from obtaining composite in-phase and opposed signals of approximately equal amplitude.

In another embodiment, several of the excitation pulses are applied for the purpose of increasing spectral resolution, where the first of the refocusing pulses after each excitation pulse is applied after a respective initial interval. If M of the excitation pulses are applied, the initial interval after the first excitation pulse will be half the time TE between the first excitation pulse and the first spin echo. The initial interval after each subsequent excitation pulse will be longer by a time equal to $TE/2M + dt/M$ than the respective initial interval after the previous excitation pulse.

The present invention thus makes it possible to acquire spectroscopic image information from a series of spin echoes using a simple pulse and gradient switching sequence without repeatedly reversing a strong magnetic gradient field. In addition, the present invention provides great flexibility, since the timing of the refocusing pulses and the observation gradients may be readily modified to obtain a desired acquisition sequence. At the same time, the use of 180° refocusing pulses in the switching sequence provides refocusing of magnetic field inhomogeneity effects, and multiple excitation pulses may be applied, each followed by a series of echoes, to obtain any desired level of resolution.

Other objects, features and advantages of the invention will be apparent from the following description, together with the accompanying drawings and the appended claims.

BRIEF DESCRIPTION OF THE DRAWINGS

FIG. 1 is a timing diagram showing a conventional pulse and gradient switching sequence used to acquire spectroscopic imaging information.

FIG. 3 is a timing diagram showing a pulse and gradient switching sequence for obtaining spectroscopic imaging information according to the invention.

FIG. 5A and 5B are timing diagrams showing examples of an alternative embodiment of the pulse and gradient switching sequence according to the invention in which echoes are obtained which may be added for compensation of $T_2$ decay.

FIG. 6 is a timing diagram showing a multiple shot embodiment of a pulse and gradient switching sequence according to the invention.

DETAILED DESCRIPTION OF THE PREFERRED EMBODIMENTS

I. General Description

Figure 2:
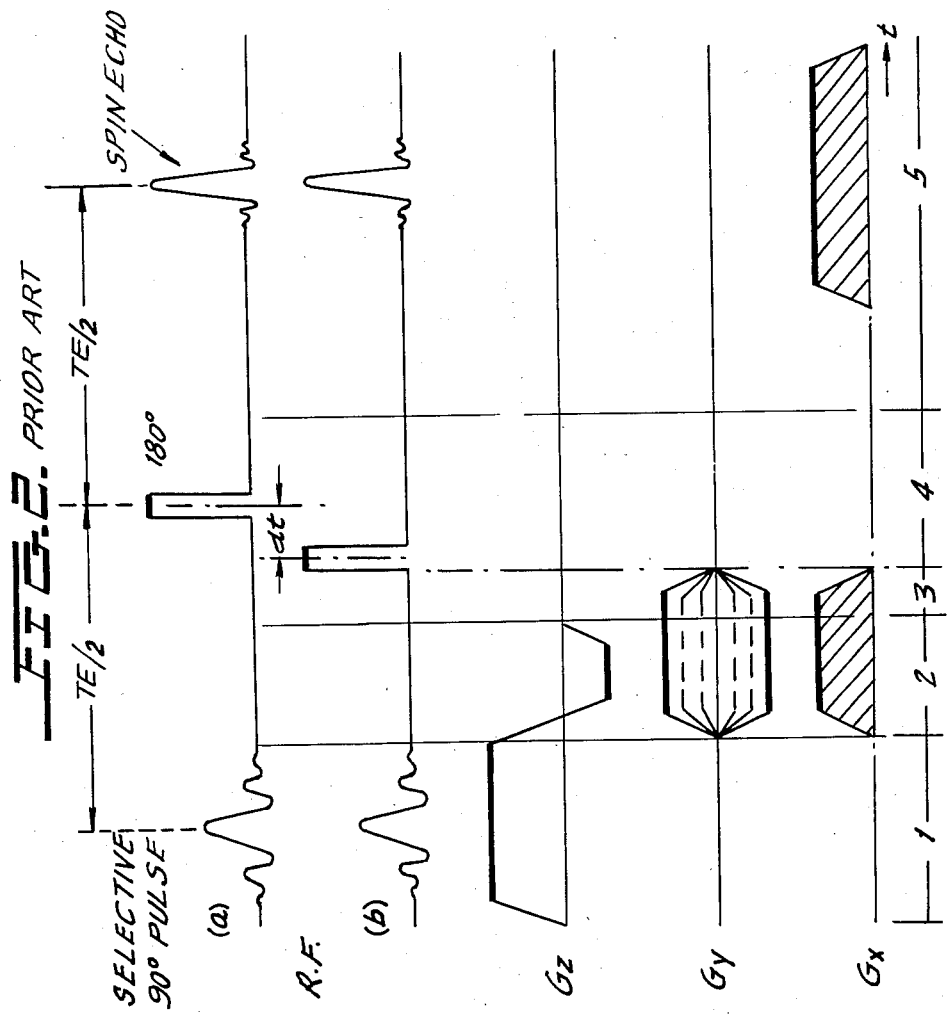
FIG. 2 is a timing diagram showing another conventional pulse and gradient switching sequence used to obtain spectroscopic imaging information.

The basic features of the present invention may be understood by comparing FIGS. 1 and 2, discussed above, with FIG. 3, showing one embodiment of the pulse and gradient switching sequence of the present invention. As discussed above, FIGS. 1 and 2 are conventional pulse and gradient switching sequences for acquiring spectroscopic imaging data.

The process of acquiring spectroscopic imaging data typically includes several distinct intervals in which specific magnetic fields are applied to the object being imaged. During the first of these intervals, designated interval 1 in all of the drawings, a group of atoms is excited. In the drawings, a slice selecting gradient field $G_z$ is applied along the Z axis during interval 1, and a selective 90° excitation pulse is applied during $G_z$, causing the atoms in a selected slice of the object to be excited. From this excited state, the atoms begin to decay according to the well-known time constants $T_1$ (spin-lattice relaxation time) and $T_2$ (spin-spin relaxation time). During the initial decay, also known as the free induction decay (FID), a negative gradient is applied along the Z axis to reverse the dephasing caused by the gradient $G_z$ after the center of the excitation pulse applied during interval 1. Also during intervals 2 and 3, spatial encoding gradients may be applied. In FIG. 1, gradients $G_x$ and $G_y$ along the X and Y axes, respectively, are both applied, with a different combination of $G_x$ and $G_y$ being applied after each excitation pulse in order to sample each location in the selected slice. In FIG. 2, however, only $G_y$ is applied for spatial encoding during intervals 2 and 3. In addition, in FIG. 2, a prephasing gradient $G_x$ is applied during intervals 2 and 3 so that an observation gradient may subsequently be applied along the X axis for phase encoding spatial information in the spin echo as it is sampled.

During interval 4, a refocusing pulse is applied, typically a 180° refocusing pulse which will cause an echo in the manner described in applicant's copending application Ser. No. 616,283, filed June 1, 1984, and incorporated herein by reference. After the refocusing pulse during interval 4, a spin echo will occur during interval 5. As shown in FIG. 1, the spin echo will occur and may be sampled without the application of any further gradient fields. In the sequence of FIG. 2, however, the observation gradient $G_x$ is applied along the X axis, causing the spin echo to be centered about the time when the integral under the observation gradient pulse is equal to the integral of the prephasing pulse applied during intervals 2 and 3. In addition, as noted above, the observation gradient provides a spatial encoding of the spin echo.

As shown in FIG. 3, the pulse and gradient switching sequence of the present invention does not end after interval 5. Instead, a second refocusing pulse is applied during interval $4_1$, resulting in a second spin echo during interval $5_1$. As shown in FIG. 3, the timing of the second spin echo is again determined by an observation gradient $G_x$. The refocusing pulse, however, is displaced in time and is applied a delay time dt after the time halfway between the first and second spin echoes. This delay produces a phase encoding of the spectral information, and advancing the refocusing pulse would also produce phase encoding. Those atoms resonating at the central frequency will not be shifted in phase, but those atoms resonating off of the central frequency will be shifted in phase in proportion to the offset from the central frequency. Therefore, the application of the refocusing pulses serves both to generate echoes and to encode the spectral information so that the subsequent spin echoes will contain both spatial and spectral information. By applying an appropriate sequence of refocusing pulses, the desired spectral information may be gathered at the same time as the spatial information, making spectroscopic imaging much more efficient than if the techniques of FIGS. 1 and 2 were used.

The basic concept of the invention may be applied in many ways. FIGS. 3, 5A, 5B and 6 illustrate three general embodiments of pulse and gradient switching sequences according to the invention.

II. First Embodiment

The pulse and gradient switching sequence of the invention, as shown in FIG. 3, may begin in the conventional manner with a slice selecting gradient $G_z$ and a selective 90° excitation pulse during interval 1. Similarly, the sequence may continue with the negative gradient $G_z$ during the interval 2 and the spatial encoding gradient $G_y$ and the prephasing gradient $G_x$ during intervals 2 and 3. It would also be consistent with the invention, however, to perform imaging without slice selection, such as three-dimensional imaging, or to perform one-dimensional imaging with line selection. Similarly, it would be consistent with the invention to perform a type of imaging other than Fourier imaging, such as projection reconstruction, in which case the spatial encoding gradient $G_y$ would not perform phase encoding as in FIG. 3.

During interval 4, a 180° refocusing pulse is applied in the absence of the gradient fields. Alternatively, a selective 180° refocusing pulse could be applied in the presence of gradient $G_z$, which would be appropriate for multiple plane imaging. In the embodiment shown in FIG. 3, the time between the center of the excitation pulse during interval 1 and the center of the first spin echo is designated as TE, and is controlled by the gradient field $G_x$ applied along the X axis.

During interval 5, for example, an observation gradient field $G_x$ is applied along the X axis and the first spin echo is sampled. Because the effect of the refocusing pulse during interval 4 is to reverse the sign of the previously applied gradients, the observation gradient field $G_x$ is effectively opposite in sign from the prephasing gradient pulse $G_x$ applied during intervals 2 and 3. The first spin echo will be centered about the time at which the integral under the observation gradient field $G_x$ is equal to the integral under the prephasing gradient pulse $G_x$ occurring in intervals 2 and 3. This will occur at the center point of the observation gradient $G_x$ in the sequence of FIG. 3, so that the second half of the observation gradient effectively performs a rephasing.

In FIG. 3, the first refocusing pulse, applied during interval 4, occurs halfway between the excitation pulse and the first spin echo during interval 5, so that it occurs a time TE/2 after the center of the excitation pulse. The spin echo is centered at a time TE/2 after the refocusing pulse consistent with the prephasing gradient pulse $G_x$ in intervals 2 and 3 and the observation gradient $G_x$ in interval 5.

During interval $5_1$, another observation gradient field $G_x$ will be applied, after a refocusing pulse during interval $4_1$. The observation gradient will again be centered at the center of the sampling period of the second spin echo. As shown in FIG. 3, however, the refocusing pulse will not occur halfway between the first and second spin echoes. Instead, it will be displaced and will occur a delay time dt after the halfway point. Because of this delay, the spins of the atoms will evolve such that the frequencies of atoms offset from the central resonance will be shifted in phase, while the frequencies of atoms on the central resonance will remain at the same phase. As a result, the second spin echo will be phase encoded with the spectral information, in addition to the phase encoding of spatial information caused by the observation gradient.

In the same manner as in intervals $4_1$ and $5_1$, a third refocusing pulse may be applied during interval $4_2$, followed by a third observation gradient and sampling period during interval $5_2$. Once again, the third refocusing pulse is shifted by a delay time dt after the time halfway between the centers of the second and third spin echoes, resulting in additional pulse encoding of spectral information. In the pulse and gradient switching sequence of FIG. 3, each of the following refocusing pulses is applied after the halfway time between the centers of adjacent spin echo signals, and in each case, the delay time dt results in an increasing phase encoding of spectral information.

The pulse and gradient switching sequence of FIG. 3 results in a series of sampled spin echoes which contain successively increasing phase differences. As a result, the sampled spin echoes provided a three-dimensional data set in which the first dimension is the sampling period, containing information about the spin evolution along the gradient $G_x$. The Fourier transform in this dimension will provide the spin distribution along the X axis. The second dimension will result from successive application of the gradient $G_y$ at different amplitudes, so that the Fourier transform in this dimension will provide spatial resolution along the Y axis. Therefore, the combination of the Fourier transforms of the first two dimensions provide a two-dimensional spin density distribution as in conventional two-dimensional Fourier imaging. The third dimension is provided by the successive echoes, and the Fourier transform in this dimension provides the frequency distribution of the spins in the absence of any applied field gradient, which will be the chemical shift spectrum for each location within the selected slice.

As noted above, the invention could also be used for one-dimensional or three-dimensional imaging. For one dimension, a line selecting gradient $G_y$, like $G_z$ in FIG. 3, will be applied with a selective 90° excitation pulse during interval 1, rather than the spatial encoding gradient $G_y$. For three-dimensions, no slice selection gradient $G_z$ will be applied, but a spatial encoding gradient $G_z$, like $G_y$ in FIG. 3, will be applied.

Figure 4:
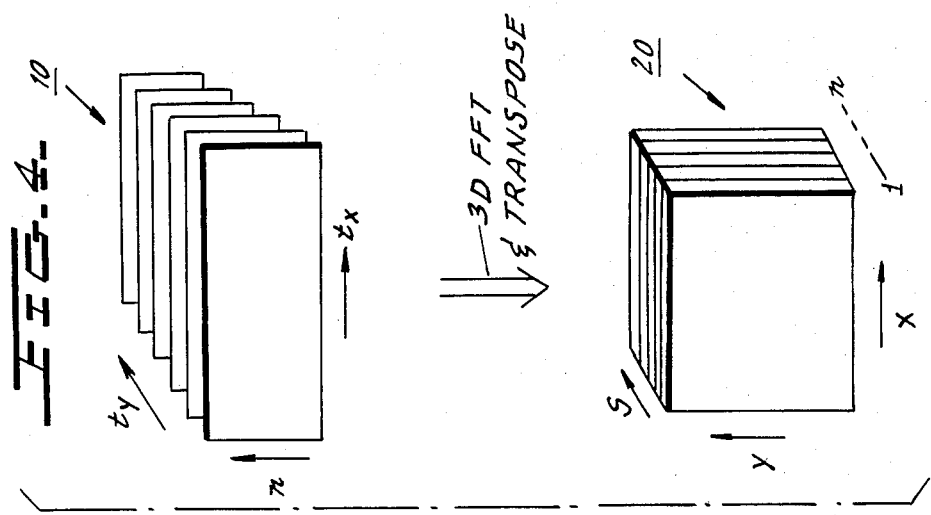
FIG. 4 is a schematic drawing showing the relationship between the data set acquired using the present invention and the resulting spectroscopic image.

FIG. 4 shows how the sampled spin echoes 10 obtained from the pulse and gradient switching sequence of FIG. 3 may be transformed into a three-dimensional image 20. As indicated, the three dimensions of the sampled spin echoes 10 are the times $t_x$ and $t_y$ and the number of spin echoes n. The three-dimensional transform may be a fast Fourier transform (FFT). The processed data can be transposed during processing to optimize data storage efficiency or to provide displays in two dimensions of the spin density distributions in the spatial dimensions of X and Y for increasing offsets in the chemical shift dimension S. Alternatively, if all three dimensions of data can be stored in computer memory, any selected spectrum or two-dimensional slice may be displayed.

In one alternative application of the sequence of FIG. 3, only the first two echoes are used, with delay time dt being chosen to provide the opposite alignment of the atoms of two substances, such as the fat and water atoms discussed in the Dixon article cited above. The data from the first and second echoes will thus provide in-phase information and opposed information, respectively. Echoes providing in-phase information and echoes providing opposed information may then be processed to obtain the in-phase and opposed images, so that the addition or subtraction of these two images will then provide images like the fat and water images described by Dixon. Due to the decay according to time constant $T_2$, however, the second echo would have a reduced amplitude, so that an error would occur in processing the echoes. In the second embodiment of the invention, this error is corrected.

III. Second Embodiment

FIGS. 5A and 5B show sequences of spin echoes generated and sampled according to the invention, but in which the error in the amplitudes of the in-phase and opposed signals resulting from $T_2$ decay may be compensated. In each sequence, at least two spin echo signals may subsequently be added to provide compensation. As noted briefly above, the $T_2$ decay between echoes will result in an amplitude difference or error. Where the sum of the second and third echoes exceeds the amplitude of the first echo, the sequence of FIG. 5A may be used to compensate. Where the sum of the second and third echoes is equal to or less than the amplitude of the first echo, it may be possible to compensate with the sequence of FIG. 5B. In each sequence, the objective is to obtain an in-phase signal and an opposed signal of nearly equal amplitude.

The pulse and gradient switching sequence of FIG. 5A is substantially the same as that of FIG. 3 through interval $5_1$. As shown, the first refocusing pulse occurs halfway between the excitation pulse and the first echo, while the second refocusing pulse, during interval $4_1$, occurs a delay time dt after the halfway time between the first and second spin echoes. Thus the first echo will be in-phase, while the second echo will be opposed if dt has the correct value.

During interval $4_2$, a third refocusing pulse is applied halfway between the centers of the second and third spin echoes. As a result, no additional phase encoding will occur between the second and third spin echoes, and the phase relation between the frequencies providing the spectral information will be the same. Thus, the third echo will also be opposed. An observation gradient applied during interval $5_2$ will again have its center at the center of the sampling period of the third spin echo.

Then, during interval $4_3$, a fourth refocusing pulse is applied in advance of the time halfway between the third and fourth spin echoes. The advance time dt' is selected to be equal to delay time dt to compensate for the delay time dt. As a result, the observation gradient during interval $5_3$ results in a spin echo in which the frequencies providing spectral information are shifted back to have approximately the same phase relation as in the first spin echo, and the fourth spin echo is inphase.

The sequence of FIG. 5A may be used to compensate $T_2$ effects by adding the first and fourth echoes to obtain a signal with the same amplitude as the sum of the second and third signals. Although the selection of dt' equal to delay time dt will adjust the phase relation of the frequencies in the fourth spin echo, it may also be necessary to adjust the timing of the fourth echo in order to obtain the desired amplitude, so that the time between the third and fourth echoes will be TE' rather than TE, as shown in FIG. 5A. The amount of the adjustment will depend on the relationship between TE and $T_2$, and adjustment will only be practical over a limited range of values of $TE/T_2$. For example, if $TE/T_2$ equals 0.1, full $T_2$ compensation can be obtained if TE' equals 1.2 TE. In general, as the ratio of $TE/T_2$ increases, the value of TE' must also increase.

For larger values of $TE/T_2$, it becomes impractical to delay the fourth echo sufficiently long to obtain $T_2$ compensation. In these cases, the sequence shown in FIG. 5B may be used, provided that the sum of the amplitudes of the second and third echoes is less than or equal to the amplitude of the first echo alone. In these cases, as shown in FIG. 5B, only the second refocusing pulse during interval $4_1$ is delayed by the delay time dt, and all the following refocusing pulses during intervals $4_2$, $4_3$, etc., occur at intervals of TE halfway between adjacent spin echoes. Therefore, the phase relation between the frequencies will be the same for the second, third and all following spin echoes and all will be opposed, while the first spin echo is in-phase. A number of these echoes may then be added together until their amplitude equals that of the first echo. For example, if $TE/T_2$ equals 0.5, then only the second and third echoes need to be added to provide $T_2$ compensation to within 3%. If $TE/T_2$ equals 0.7, then six echoes, the second through the seventh echoes, must be added to compensate to within 3%, and exact compensation cannot be obtained because the additional signal from additional echoes is too small. For even larger values of $TE/T_2$, such as $TE/T_2$ equals 1, compensation is no longer possible.

From the above discussion, it will be apparent that the exact timing and the number of echoes used to obtain $T_2$ compensation will depend upon the $T_2$ value of the observed spin system, which must be known in order to perform effective compensation. If the tissues to be imaged have several $T_2$ values, full compensation for all tissue types with different $T_2$ values will not be possible.

In the pulse and gradient switching sequences of FIGS. 3, 5A and 5B, a limited number of echoes may be sampled in order to obtain the desired information. One of the significant advantages of the present invention, however, is that it makes it possible to sample the spectral information at any arbitrarily chosen level of resolution. The third embodiment of the present invention provides a technique for such sampling.

IV. Third Embodiment

In the pulse and gradient switching sequence of FIG. 3, it is theoretically possible to obtain any arbitrarily chosen level of spectroscopic resolution by selecting an appropriate delay time dt. If a spectral range of P Hz is being observed, then the sampling of the spectral information performed by the incremented delays of the refocusing pulses must satisfy the Nyquist sampling theorum. Therefore, the delay time dt must be no longer than 1/(2 P). With quadrature detection and processing of data in complex format, the spectral resolution will be equal to P/N Hz, in which N represents the number of echoes generated and sampled. Therefore, by choosing a small enough value of dt and a large enough number of echoes generated and sampled. Therefore, by choosing a small enough value of dt and a large enough number of echoes N, any arbitrary level of resolution may be obtained. As a practical matter, however, the $T_2$ decay will limit the number of echoes which can be obtained in a single pulse and gradient switching sequence following an excitation pulse.

In order to solve this problem, the multiple shot pulse and gradient switching sequence of FIG. 6 may be used, in which, for each value of the phase encoding gradient $G_y$, several excitation pulses are applied to obtain a desired number of spin echoes N. A similar technique is discussed by Mehlkopf, A.F., van der Meulen, P., and Smidt, J., "A Multiple Echo and Multiple Shot Sequence for Fast NMR Fourier Imaging", Scientific Program Society of Magnetic Resonance in Medicine, Second Annular Meeting, Aug. 16-19, 1983, San Francisco, Abstract No. 25, Works in Progress. As shown in FIG. 3, the pulse and gradient switching sequence of each of the shots will be the same as that of FIG. 3 during intervals 1, 2 and 3 and during intervals 5, $4_1$, $5_1$, and so forth. The application of the first refocusing pulse during interval 4, however, may be timed differently in each of the multiple shots, in order to obtain the desired spectral information and level of resolution.

As shown in FIG. 6, each of the shots may be designated with a letter m, which will range from zero to M-1, where M represents the total number of shots. In the first shot, in which m equals zero, the first refocusing pulse is applied halfway between the center of the excitation pulse and the center of the first spin echo, as in FIG. 3. In the second shot, however, in which m equals 1, the refocusing pulse will follow a longer initial interval of $TE/2 + dt_1$, where $dt_1$ equals $TE/2M + dt/M$. In general, for each of the following shots, in which m equals 2, 3 and so forth, the first refocusing pulse will follow an initial interval equal to $TE/2 + dt_m$ where $dt_m$ equals $(m.TE)/2M + (m.dt)/M$. If N spin echoes are obtained in each shot, the total number of sampled spin echoes will be N×M. It may be seen that the delay of the first refocusing pulse in each shot will be $m(dt_1)$, where m ranges from zero to M-1. In this way, a full data set is generated, at the desired arbitrary level of resolution, so that a three-dimensional Fourier transform generates the two-dimensional spectroscopic image desired.

IV. Miscellaneous

In all methods of spectroscopic imaging, the effects of field inhomogeneity must be accounted for in order to distinguish between changes in the spin resonance frequencies caused by chemical shift and changes caused by field inhomogeneity. The sequences of the present invention, however, reduce the effects of field inhomogeneity because each refocusing pulse also refocuses the field inhomogeneity effects. Nonetheless, correction may be necessary. One conventional technique for correcting for field inhomogeneity is to obtain a reference data set from an object which has a continuous distribution of a known spin resonance. This reference data set is then used to obtain a map of the field distribution. The field map may then be used as a template to give the frequency error at each position within the image plane, and the spectral data may then be shifted by the frequency error at each position to correct for field inhomogeneity. This and other correction techniques may be understood more fully from the literature, including A. A. Maudsley and S. K. Hilal, "Field Inhomogeneity Correction and Data Processing for Spectroscopic Imaging" presented to the 1983 meeting of the Society of Magnetic Resonance in Medicine, San Francisco; W. T. Dixon, "Simple Proton Spectroscopic Imaging", *Radiology*, Vol. 153, No. 1 (October, 1984), pp. 189-194; and I. L. Pykett and B. R. Rosen, "Nuclear Magnetic Resonance: *In Vivo* Proton Chemical Shift Imaging", *Radiology*, Vol. 149, No. 1 (October, 1983), pp. 197-201.

Many modifications of the pulse and gradient switching sequences of the invention may be made. The usual modifications of Fourier imaging methods may be used, including a non-selective excitation pulse, with spatial phase encoding in two dimensions and sampling in a third dimension to obtain a volume measurement. In this example, the multiple echo phase encoding of the spectral information will provide the fourth dimension of the data set. In addition, the refocusing pulses could be phase cycled to compensate for pulse imperfections as in applicant's copending application Ser. No. 616,283, discussed above.

The pulse and switching sequences of the present invention may be implemented on most commercially available NMR imaging systems. One example of such a system is described in applicant's co-pending application Ser. No. 616,283, incorporated herein by reference. A more general discussion of the requirements of such a system may be found in A. A. Maudsley, S. K. Hilal and H. E. Simon, "Electronics and Instrumentation for NMR Imaging", IEEE *Transactions on Nuclear Science*, Vol. NS-31, No. 4 (August, 1984), pp. 990–993.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A method of acquiring NMR information, comprising:
   exciting at least some of the atoms of an object;
   providing a plurality of refocusing pulses, each for generating a respective spin echo signal; after each refocusing pulse, providing a corresponding observation gradient field during the respective spin echo signal for spatially encoding the excited atoms; providing the plurality of refocusing pulses comprising timing at least one of the refocusing pulses in relation to the corresponding observation gradient field for spectrally encoding the excited atoms, thereby causing the excited atoms to provide both spatial and spectral information in the respective spin echo signal; and
   after at least one of the refocusing pulses, receiving the respective spin echo signals from the object.

2. The method of claim 1 in which exciting the atoms comprises exciting the atoms of the object by applying at least one excitation pulse to the object.

3. The method of claim 2 in which the observation gradient field is applied in a first direction, exciting the atoms further comprising applying a slice selecting magnetic gradient field to the object while applying the excitation pulse, the slice selecting gradient field being applied in a second direction orthogonal to the first direction.

4. The method of claim 3, further comprising, before providing the refocusing pulses, applying a spatial encoding magnetic gradient field in a third direction orthogonal to the first and second directions for spatially encoding the excited atoms.

5. The method of claim 2 in which the excitation pulse and the spin echo signals each have a respective center, providing the refocusing pulses comprising applying a first refocusing pulse halfway between the respective center of the excitation pulse and the respective center of the respective spin echo signal generated by the first refocusing pulse.

6. The method of claim 5 in which providing the refocusing pulses further comprises applying a second refocusing pulse at a time displaced from the time halfway between the respective centers of the respective spin echo signals generated by the first and second refocusing pulses.

7. The method of claim 6 in which the second refocusing pulse is applied a delay time after the time halfway between the respective centers of the respective spin echo signals.

8. The method of claim 7 in which providing the refocusing pulses further comprises applying third and following refocusing pulses, each of the third and following refocusing pulses being applied the delay time after the time halfway between the respective centers of the respective spin echo signals generated by the preceding refocusing pulse and the refocusing pulse being applied.

9. The method of claim 8 in which the delay time is half the reciprocal of a spectral range being observed.

10. The method of claim 7 in which providing the refocusing pulses further comprises applying a third refocusing pulse halfway between the respective centers of the respective spin echo signals generated by the second and third refocusing pulses.

11. The method of claim 10 in which providing the refocusing pulses further comprises applying a fourth refocusing pulse an advance time before the time halfway between the respective centers of the respective spin echo signals generated by the third and fourth refocusing pulses.

12. The method of claim 11 in which the advance time is equal to the delay time.

13. The method of claim 1 in which providing the refocusing pulses and the corresponding observation gradient fields comprises timing the refocusing pulses and the observation gradient fields so that at least one received spin echo contains in-phase information relating to a pair of substances in the object and at least one received spin echo contains opposed information relating to the pair of substances in the object.

14. The method of claim 13 in which providing the refocusing pulses and the corresponding observation gradient fields further comprises timing the refocusing pulses and observation gradient fields so that at least two of the received spin echo signals contain the same one of the in-phase and opposed information and may be added to compensate for $T_2$ decay.

15. The method of claim 14 in which receiving the spin echo signals comprises receiving first, second, third and fourth spin echoes, the refocusing pulses and observation gradient fields being timed so that the first and fourth spin echoes contain in-phase information and may be added to obtain a signal with an in-phase amplitude, and the second and third spin echoes contain opposed information and may be added to obtain a signal with an opposed amplitude approximately equal to the inphase amplitude.

16. The method of claim 14 in which receiving the spin echo signals comprises receiving first and second spin echoes and at least one following spin echo after the second spin echo, the refocusing pulses and observation gradient fields being timed so that the first spin echo contains in-phase information and the second spin echo and the following spin echo contain opposed information and may be added to obtain a signal with an amplitude approximately equal to the first spin echo.

17. The method of claim 1 in which exciting the atoms comprises applying a plurality of excitation pulses to the object; a plurality of the refocusing pulses being provided after each excitation pulse.

18. The method of claim 17 in which the providing of the refocusing pulses after each excitation pulse comprises applying a respective first refocusing pulse after a respective initial interval after each excitation pulse, the excitation pulses including M excitation pulses, one of the M excitation pulses being a first excitation pulse, the respective initial interval after the first excitation pulse being half the time TE between the first excitation pulse and the center of the respective spin echo signal generated by the respective first refocusing pulse, the providing of the refocusing pulses comprising applying at least some refocusing pulses displaced by a time dt from the time halfway between the centers of the respective spin echo signals generated by the preceding refocusing pulse and the refocusing pulse being applied; the respective initial interval after each following excitation pulse being longer by a time equal to (TE+2dt)/2M than the respective initial interval of the previous excitation pulse.

* * * * *